(12) United States Patent
Gelbart et al.

(10) Patent No.: US 6,295,076 B1
(45) Date of Patent: Sep. 25, 2001

(54) METHOD OF INCREASING IMAGING RESOLUTION

(75) Inventors: Daniel Gelbart; Amos Michelson, both of Vancouver (CA)

(73) Assignee: Creo SRL, Burnaby (CA)

( * ) Notice: Subject to any disclaimer, the term of this patent is extended or adjusted under 35 U.S.C. 154(b) by 0 days.

(21) Appl. No.: 09/107,903

(22) Filed: Jun. 19, 1998

(51) Int. Cl.⁷ .................. B41J 2/32; B41J 2/44; B41J 2/447; B41J 2/465; B41J 2/47
(52) U.S. Cl. .................................. 347/171
(58) Field of Search ..................... 347/171, 224, 347/238; 400/120.01; 360/24

(56) References Cited

U.S. PATENT DOCUMENTS

| 4,619,894 | * | 10/1986 | Bozler et al. | 430/942 |
| 4,743,091 | * | 5/1988 | Gelbart | 350/252 |
| 5,208,818 | * | 5/1993 | Gelbart | 372/30 |

* cited by examiner

*Primary Examiner*—Huan Tran

(57) ABSTRACT

Imaging resolution can be increased by separating image data into a plurality of overlapping subsets and imaging each subset independently on an imaging material responsive only to the instantaneous intensity of the light an not to the accumulated exposure. The method is particularly suitable for thermal recording as thermal materials respond to the instantaneous temperature. The preferred separation is when an image subset contains only image features of a single size.

17 Claims, 6 Drawing Sheets

METHOD OF INCREASING IMAGING RESOLUTION

FIELD OF THE INVENTION

The invention is related to optical imaging, both by direct writing using a laser beam and by imaging a mask, and in particular to optical microlithography and optical data storage.

BACKGROUND OF THE INVENTION

In many areas of optical imaging, particularly in the production of integrated circuits and flat panel displays using microlithography as well as in optical data storage, there is a desire to reduce the size of the image features. The resolution of an imaging system is given by the equation k $\lambda$/NA where $\lambda$ is the wavelength of the light, NA is the numerical aperture of the optical system, and k is a constant depending mainly on the type of material being imaged. Typical values of k are between 0.5 and 1. Today's system for microlithography used very short wavelength (down to 200 nm) and very large NA (up to 0.6) thus the potential for increased resolution, using optical means, is limited. Optical data storage devices are limited to wavelengths available from laser diodes therefore cannot go down below 400 nm at the present time. The main object of this invention is to image features smaller than possible using prior art methods and particularly smaller than predicted by the above equation for a given material. In this disclosure the word "light" should be interpreted as any energy beam, visible or not. In this context "light" is any radiation from x-rays to infrared, including electron beams and ion beams and imaging using magnetic or electric fields, such as magnetic data storage. Recording material in this disclosure means any material which reacts to an imagewise exposure by an energy beam such as film, photoresist, thermoresist, optical data storage coatings etc. The main emphasis of the invention is light, and in particular short wavelengths of light such as blue and UV, since it generates high resolution images.

Recording materials can be generally divided into two groups: those responding to exposure and those responding to the instantaneous value of the light (or radiation). Exposure is defined in optics as the integral of the light intensity over time: $E=\int Idt$. Traditional imaging materials such as photographic films or photoresists respond to exposure. When exposure reaches a threshold value a permanent change occurs in the material; for example a photoresist will change its solubility in the developer. Since these materials respond to exposure, a light intensity I for a duration of t will give the same exposure as 10I for a period of 0.1t (10I× 0.1t=It). This is also know as the "law of reciprocity". Once the exposure reached the threshold value the change is normally permanent but it does not have to be permanent. Many materials are erasable or reversible. Since the exposure is a linear function of both I and t, the principle of linear superposition also holds for these materials. This principle states that $f(a+b)=f(a)+f(b)$; in other words if an image is separated into two components, "a" and "b" and they are imaged separately the result will be identical to imaging them together as a single image of "a +b". Exposure which did not reach threshold may not have visible effects but it is stored in the material and will combine with any future exposure.

There are classes of imaging materials not obeying the "reciprocity law " or linear superposition of images. The best known are thermal imaging materials. For example, optical data storage materials such as the well known Recordable Compact Disk (CD-R) respond to the peak temperature reached by the laser writing spot. When the peak temperature exceeds a threshold value, a change (permanent or reversible) occurs. An exposure to a lower temperature has no effect as the heat will dissipate and material will return to room temperature and will have no "memory" of partial exposures. True thermal recording materials cannot obey the "law of reciprocity" since they need to be exposed to the room temperature for extended periods of storage and no accumulated effect is allowed. It is easy to see why a recording material based on a physical change, such as melting or ablation, will not follow the reciprocity law. Many materials based on a chemical change can also be engineered not to follow the reciprocity law and respond only to the instantaneous value of the light or radiation. Chemical reactions, in general, double in speed for a temperature increase of 10° C. A chemical reaction can progress a billion times faster at 325° than at 25° C., as 2 exp (325–25)≈10 exp 9. Such a chemical reaction will appear to have a sharp threshold temperature. Any heating below this threshold will not have a permanent effect, as the amount of materials reacting will be very small. Since it is easy to raise the temperature of a thin film to over 1000° C. by bringing a laser to focus on the material, these materials will not follow the law of reciprocity. If an image is separated into two images, each one exposing the recording material separately, the result will be quite different as any heat below the threshold value will dissipate and not add up to the previous exposure. The current invention takes advantage of this property in order to separate a high resolution image into a set of images, each exposed separately, and each one containing only part of the information of the original image. In the following disclosure the word "pixel" is used to describe the smallest feature used as an image. In some cases images do not contain single pixel features, however in this disclosure the smallest feature will be referred to as a pixel. For example, if the smallest feature of an image is 1 micron lines created by stepping a spot of 0.3 micron in increments of 0.1 micron, in this disclosure one pixel will be considered one micron, regardless of the addressability used to create the image.

The behavior of materials obeying linear superposition can be seen in FIG. 1, FIG. 2, FIG. 3 and FIG. 4 depicting prior art. In FIG. 1 a mask 1 containing clear openings 4 is illuminated by light source 2 and imaged on recording material 5 using lens 3. Instead of mask 1 data can be used to modulate light source directly, as shown in FIG. 2 wherein laser 6 is being modulated by data 8. Light from laser 6 is collected by lens 7 and imaged on material 5 using lens 3. The layout of FIG. 2 is more typical of an optical data storage application while FIG. 1 is more typical of microlithography. The principles of the invention apply equally to both configurations as well as numerous other configurations and materials. Referring now to FIG. 3, the effect of limited resolution of the optical system is shown. Mask 1 contains high resolution (single pixels in FIG. 3) patterns. The light distribution next to the mask surface is an accurate copy of the mask, as shown by graph 9. After imaging by lens 3 a light distribution 10 is created on the surface of recording material 5. In order to fully resolve all patterns, graph 10 has to cross the threshold 11 for all features. For example, an isolated clear pixel in a large area (pixel #5 in FIG. 3) may barely cross the threshold 11 as some of the light from pixel 5 spread out. A similar problem occurs between pixels #14, 15, 16 where the lens cannot fully resolve the individual pixels. Threshold 11 is the exposure value causing recording material 5 to change. For example if material 5 is a photoresist threshold 11 is the exposure required to switch it from soluble to non soluble (for negative resist) or the other way (for positive resist). Even if a threshold 11 is found to resolve all pixels the image on recording material 5 will be distorted, as can be seen by comparing 5 to mask 1.

The situation cannot be improved by separating the information on mask 1 into multiple overlapping masks, each one carrying part of the image. This is shown in FIG. 4 mask 1 of FIG. 3 is replaced by two masks: 1A, carrying only the even numbered openings; and 1B for the odd-numbered openings. The two masks create exposure functions 9A and 9B which become respectively 10A and 10B on the surface of recording material 5. Even if the masks are used sequentially, recording material 5 will add up exposures 10A and 10B for an equivalent exposure 10, and end results will be identical to FIG. 3. This was expected as in linear system (i.e. obeying reciprocity law) the response to a function is the sum of the responses to the components of that function, as stated by the principle of linear superposition. It makes no difference if the image data comes from a mask or by direct modulation of the light, as shown in FIG. 2.

SUMMARY OF THE INVENTION

Imaging resolution can be increased by separating image data into a plurality of overlapping subsets and imaging each subset independently on an imaging material responsive only to the instantaneous intensity of the light and not to the accumulated exposure. The method is particularly suitable for thermal recording as thermal materials respond to the instantaneous temperature. The method is particularly beneficial when an image subset contains only image features of a single size.

DETAILED DESCRIPTION OF THE PREFERRED EMBODIMENT

Figure 1:
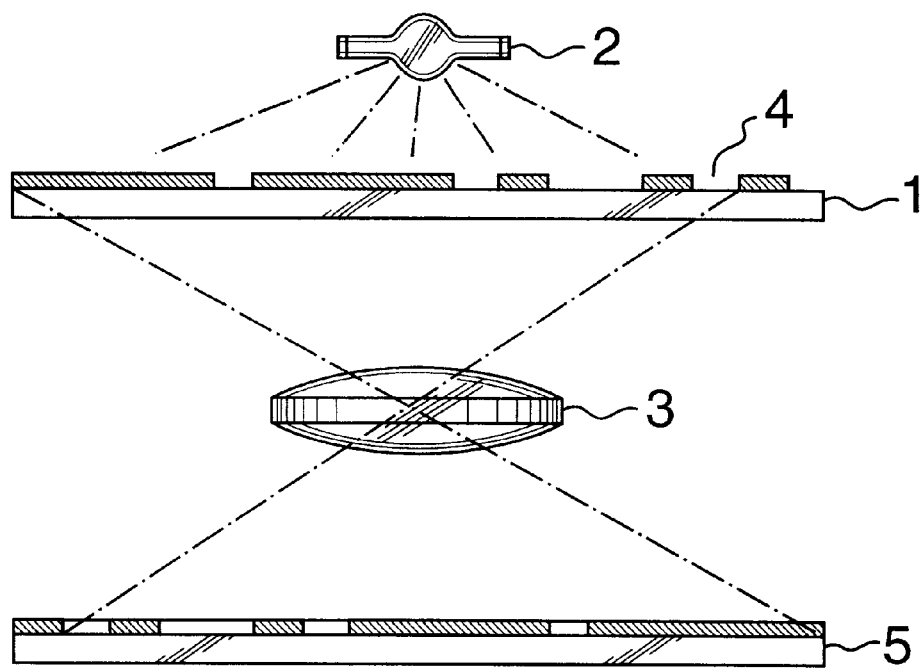
FIG. 1 shows prior art method of imaging when using a mask.
Figure 2:
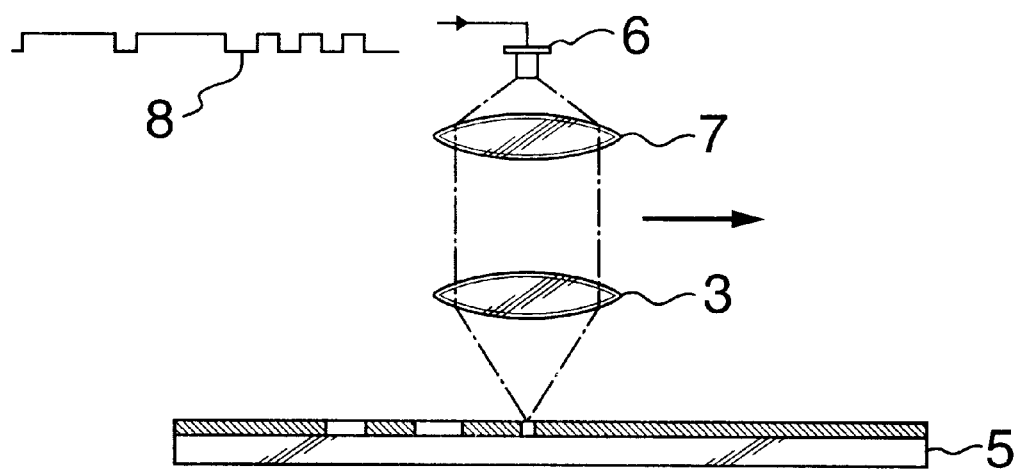
FIG. 2 shows prior art method of imaging when using a directly modulated laser.
Figure 4:
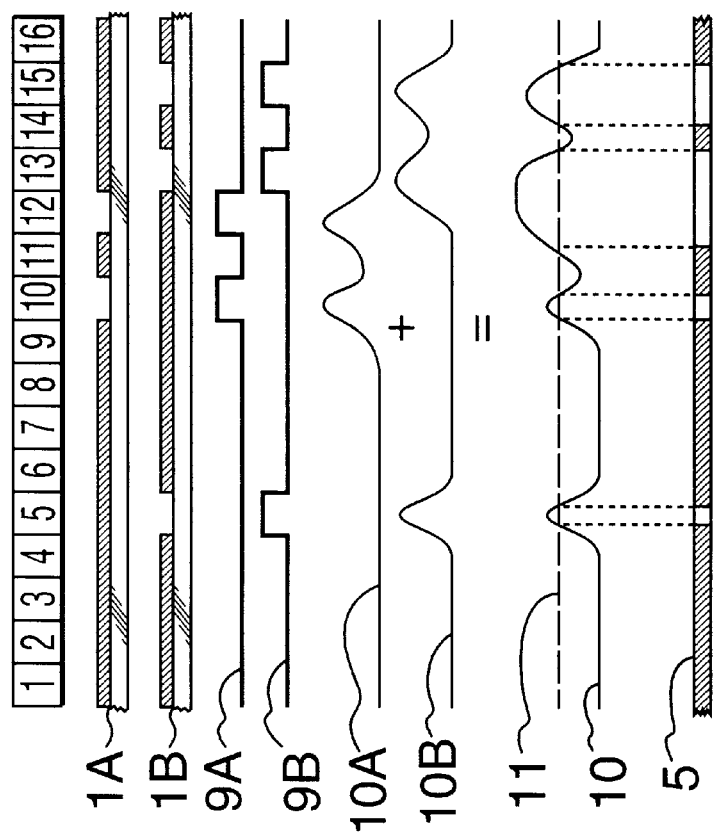
FIG. 4 shows distribution of light in prior art imaging when image is separated into overlapping image subsets.
Figure 5:
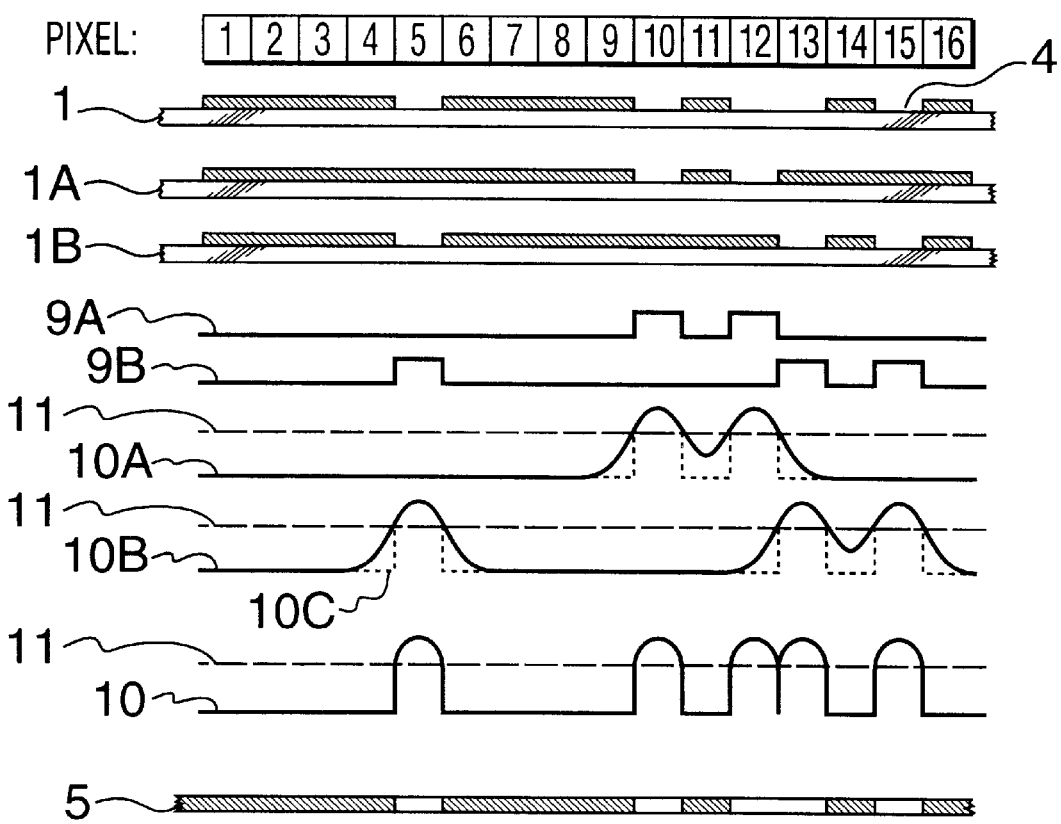
FIG. 5 shows imaging according to the invention when image is separated into overlapping image subsets.

According to the invention, an image to be recorded is divided into overlapping subsets, each image subset containing only part of the information of the original image and therefore being easier too image at high resolution. Recording such an overlapping subset of images, in register, on a recording material which does not obey the law of reciprocity generates a high resolution recorded image, having significantly higher resolution than recording the original image. The explanation of this effect is shown in FIG. 5, depicting for clarity, a one dimensional mask 1. It is clear that since most images are two dimensional, mask 1 should be viewed as a cross section of a two dimensional mask. The recording process follows the prior art layout shown in FIG. 1, where mask 1 having clear openings 4 is illuminated by light source 2 and imaged on recording material 5 using lens 3. For clarity lamp 2 and lens 3 are not shown in FIG. 5. Returning now to FIG. 5, image 1 can be a physical object such a film or a mask or can also be a virtual image, formed by another optical system. For clarity, image 1 in FIG. 5 is a physical mask having clear and opaque areas. Referring to the smallest feature of image 1 as a "pixel" (although the smallest feature could be made up from many pixels), the image can be divided into two subsets, 1A and 1B, each one made into a separate mask. By the way of example, mask 1A contains only the openings 4 corresponding to even numbered pixels and mask 1B contains only odd-numbered openings. Since the light can pass through mask 1 only via openings 4, all opaque areas do not contribute to the formation of the image on recording material 5. While FIG. 5 shows separating the image into odd and even pixels, there are many other ways of dividing an image into subsets, such as by feature size, feature shape, orientation, etc. The term "subset" should be interpreted in a general sense, meaning a set containing information related to the original image, which, when combined with other subsets, generates the original image. A subset can contain more details or less details than the original image. For example, dividing a large clear area into odd and even subsets creates subsets with more details than the original image, as each subset has a large number of clear and opaque pixels.

Figure 3:
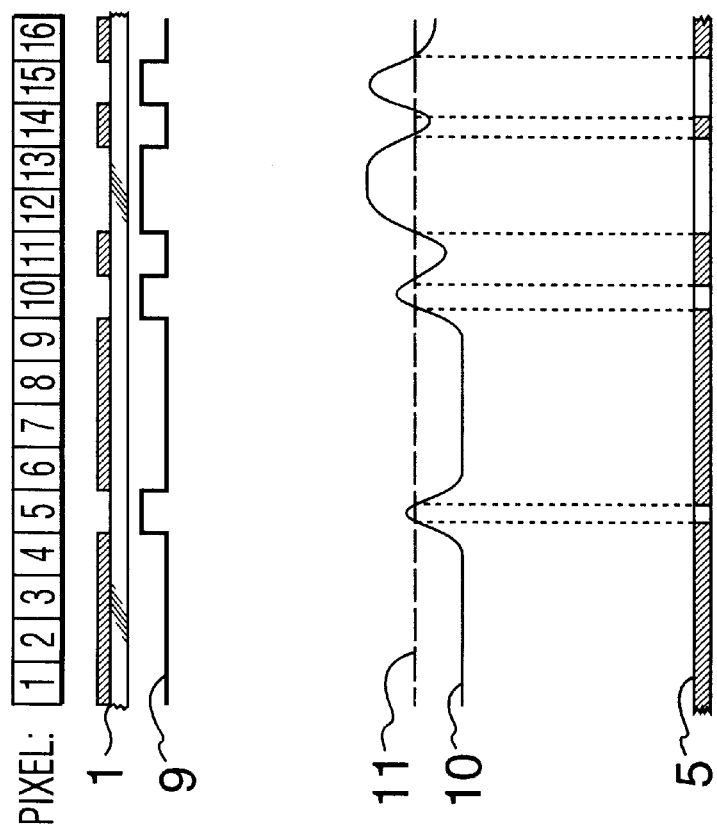
FIG. 3 shows distribution of light in prior art imaging.

Returning now to FIG. 5, when image subset masks 1A and 1B are imaged in sequence and in register onto recording material 5, a high resolution image will result. The light distribution just below masks 1A and 1B are shown by graphs 9A and 9B As the optical system imaging this light distribution has a limited resolution, the light distribution of the image created on recording material 5 is shown by graphs 10A and 10B, corresponding to masks 1A an 1B. For clarity graphs 10A and 10B are shown at the same scale and orientation as 1A and 1B, while it will be understood that in many optical systems imaging can involved a change of scale and orientation. As long as the features of the masks 1A and 1B are large in comparison to the resolution of the optical system, there is little difficulty in accurate reproduction of the image. In practice, however, most optical systems are used at their limits of resolution in order to record the smallest possible features. This is particularly true in the microlithography field and in optical data storage. Under such conditions, graph 10A and 10B will be a severely distorted version of 9A and 9B. The light from each pixel will spread over an area larger than a pixel, causing interaction with adjacent pixels as well as reduced peak intensity (as the area under the graph has to remain constant, since no new light is being generated by the imaging process). If recording material does not follow the law of reciprocity, and particularly if recording material responds only to the instantaneous intensity of the light and not to the accumulated exposure (i.e. responds to I and not to $\int Idt$) significant gains can be achieved. Recording material will be marked in all areas where intensity exceeded the marking threshold 11. In all areas where intensity distribution 10A and 10B did not exceed threshold 11 there will be no permanent effect, as the effect will reduce to zero as soon as the light intensity will be reduced to zero. To illustrate such a process, assume recording material 5 is an optical recording material responding to the peak temperature it reaches. An example of such a material is the well known Recordable Compact Disc (CD-R). In this case graphs 10A and 10B represent the instantaneous temperature of recording layer 5. Needless to say that for such a thermal recording process the duration of the exposure has to be very brief, typically below one microsecond, to avoid all the heat escaping from the thin recording layer. The recording material will be marked all areas where the threshold temperature 11 was exceeded and all heat will dissipate, without leaving any effect, in all areas not reaching threshold 11. This converts graph 10B to an effective graph 10C which has a higher apparent resolution. A similar sharpening also occurs in graph 10A. This also allows the superposition of two images, 10A and 10B, without interaction between them. When temperature distribution 10A and 10B are applied sequentially to recording material 5 the result will be an equivalent exposure profile 10, since there will be no interaction between 10A and 10B as long as some time elapsed between the exposures. This time delay is required to allow most of the thermal effects from one exposure to dissipate before the other exposure is applied. It should be understood that if exposures 10A and 10B are applied simultaneously, there is nothing to be gained by the invention, since the temperature profiles will combine under the law of linear superposition, even if the recording material does not obey linear superposition. In other words, if exposures 10A and 10B are applied simultaneously the equivalent exposure shown as 10 in FIG. 3 will result, without any benefit of increased resolution. The time delay between exposures can be as short as a single thermal time constant, but preferably a delay of at least 5 time constants should be used. Since most recording layers are very thin (0.2–2 microns) such a delay amounts only to a fraction of a millisecond. If this is done, recording material 5 will display a high resolution reproduction of mask 1 with very low distortion of features. This can be seen by comparing FIG. 5 to FIG. 3, which shows prior art recording. While this example used a thermal recording process as an illustration of a recording material not obeying the law of reciprocity, the invention is not limited to thermal recording. Any recording material having a sharp threshold and not showing an accumulated effect of exposure to energy below the threshold can be used.

A different material which can be used to illustrate the invention is a thermoresist. A thermoresist is similar to a photoresist except it changes property when it reaches a threshold temperature. An example of such a thermoresist, is disclosed in U.S. Pat. No. 4,619,894. A third example of such a material is a processless thermal film sold under the tradenames Helios and DryTech by the Polaroid Corporation (Cambridge, Mass.). If changes from black to clear in areas where the temperature exceeded a threshold value.

The preferred way of separating the image into subsets is to have each subset contain features of a single size separated from each other. For example, in FIG. 5 subset mask 1A and 1B only contain single-pixel openings separated from each other by at least one pixel. The advantage will become apparent by nothing that in such a case all peaks of intensity (e.g. temperature) on graphs 10A and 10B will be of similar amplitude, as they were all generated by single pixel features. In such a case the light level can be increased to have graphs 10A and 10B intersect threshold 11 at the correct amplitude, generating the correct feature width on recording material 5. If single pixel features are mixed with multiple pixel features the different peaks of graphs 10A, 10B will have different amplitudes for different features and no light level can be found giving the correct width of marks on recording material 5. Such a condition is typical of prior art and shown in FIG. 3.

Figure 6:
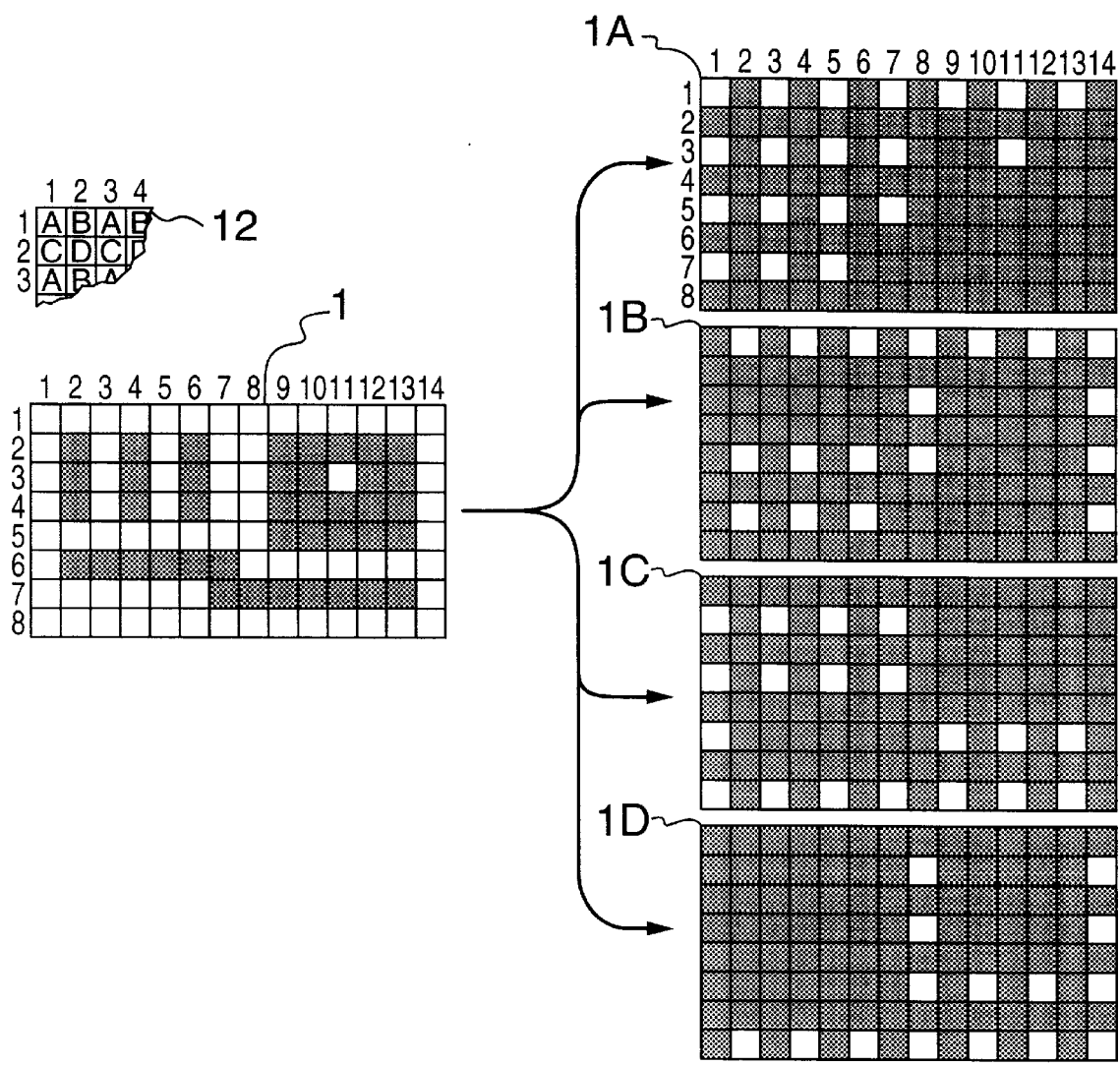
FIG. 6 shows an example of separating the image into overlapping image subsets according to the invention.
Figure 7:
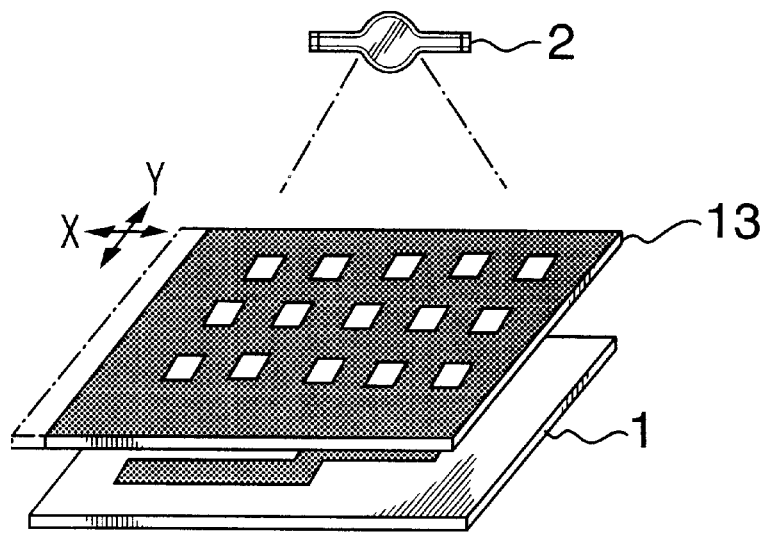
FIG. 7 shows an alternate method of separating an image into image subsets according to the invention.

There are many methods of separating an image into multiple images (subsets) each one consisting of equal size features separated from each other. One embodiment is shown in FIG. 6, in which mask 1 is separated into four subset masks 1A, 1B, 1C and 1D, according to the method shown by insert 12: Mask 1A only contains the clear pixels (openings) which have an odd row and column number. Mask 1B contains openings having odd row and even column number. Mask 1C contains openings located at even rows and odd columns and Mask 1D contains openings located at even rows and columns. Obviously the total number of openings on masks 1A, 1B, 1C, and 1D equals the total openings (clear pixels) on Mask 1, however, all openings on masks 1A, 1B, 1C and 1D have the same size and are separated from each other by at least one pixel. When these four mask are image sequentially and in register on recording material 5 (with light level increased to achieve correct feature size), a high resolution undistorted image results. The less the recording material 5 obeys the reciprocity law the bigger the improvement over prior art achieved by the invention. For this reason the invention is particularly effective with thermal recording materials but can be used with a large number of highly non-linear materials. FIG. 7 shows a different embodiment of the principle of the invention. Instead of replacing mask 1 by multiple mask, a second mask 13 is located in close proximity to mask 1 (or an image of mask 1). Mask 13 has a grid of openings (clear pixels) which allow only a subset of mask 1 to be exposed at any given exposure. By the way of example, if mask 13 has only clear pixels located at even numbered rows and columns, it can be used to separate mask 1 into four subsets by moving it one pixel in X and Y direction between subsequent exposures. Since the movement is small, it may be faster to move mask 13 than changing masks in the manner illustrated in FIG. 6.

Figure 8:
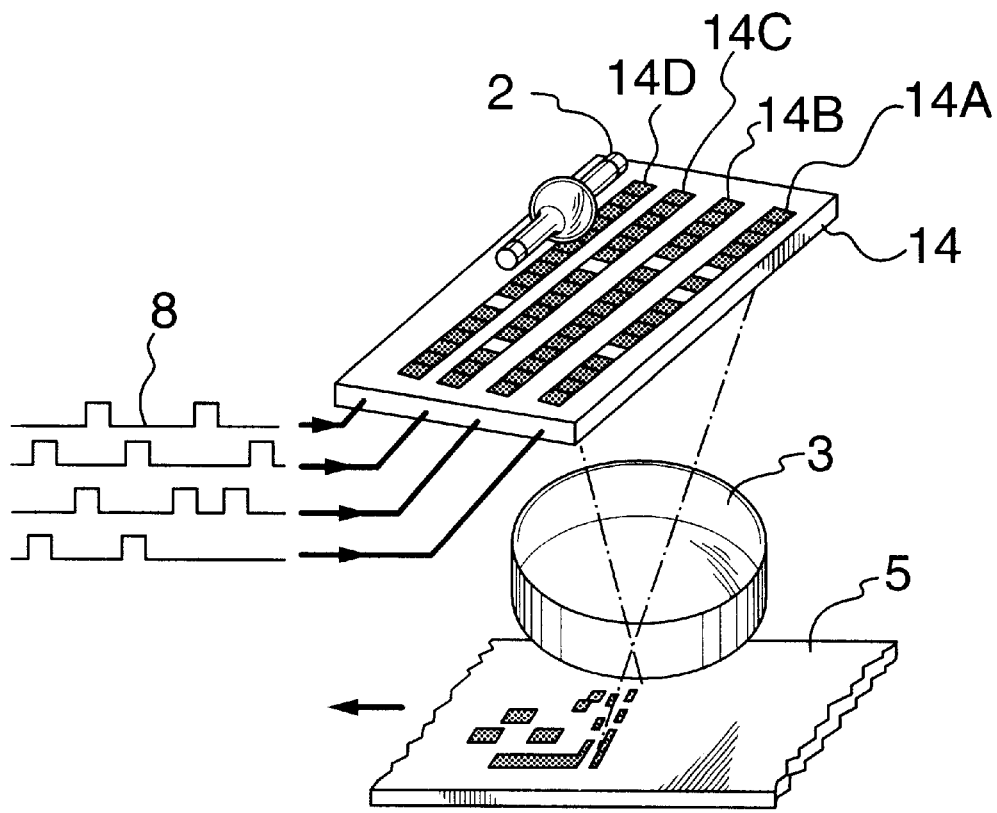
FIG. 8 shows a method of sequentially imaging subsets of an image by using an electronically alterable mask.

The mask can also be in an electronically alterable form. It is well known that an electronic display or a light valve can be used as an image. In FIG. 8 a transmissive light valve 14 is illuminated by light source 2 (which can be a lamp CW, laser pulsed, excimer laser or any energy source). The short exposure times preferred in this invention (since materials respond only to the peak intensity, any exposure much longer than the response time of the material is wasted) are achieved by relative motion between the image and recording material 5. When using a light valve the different image sub-set can be imaged at the same time as long as they are imaged at different locations of recording material 5. This is the same as imaging a given location at different times. By the way of example, transmissive light valve 14 is illuminated by light source 2 and contains multiple rows 14A, 14B, 14C and 14D generating images on material 5. Since relative motion exists between material 5 and image projected by lens 3, each point will receive four exposures. Image can now be divided into four subsets, similar to previous example: row 14A only carries data of odd rows and columns, row 14B carries data of odd rows and even columns, etc. A different way of dividing the image is to send every fourth bit of a row to one of the light valve rows. For example, if a row of image data contains pixels 1, 2, 3, 4, etc., send pixels 1, 5, 9, 13 (if they are "on" e.g. open) to row 14A pixels 2, 6, 10, 14 to 14B pixels 3, 7, 11, 15 to 14C and 4, 8, 12, 16 to row 14D. In this manner all the data is fed to all rows however the data in each row is "masked" by an electronic mask which only enables one pixel in four. As a result any pixel is always separated by at least three pixels from any other pixel when it is being written, minimizing any interaction between pixels. In this example the light source has to be pulsed, to avoid any interaction in the other (motion) direction. An alternative to pulsing is adding rows and using them alternately, with only odd or even numbered rows active at any given time. Clearly the distance between rows has to be sufficient for any time dependent affects to decay. For thermal recording this requires that a time delay of a few thermal time constants separates consecutive exposures of the same area.

Figure 9:
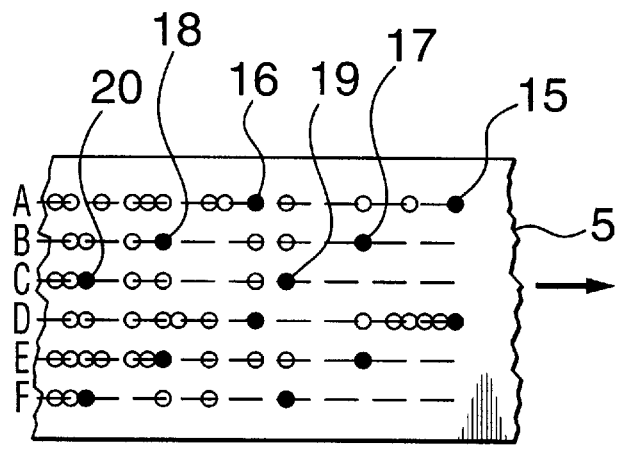
FIG. 9 show a method of implementing the invention by using directly modulated laser beams.
Figure 10:
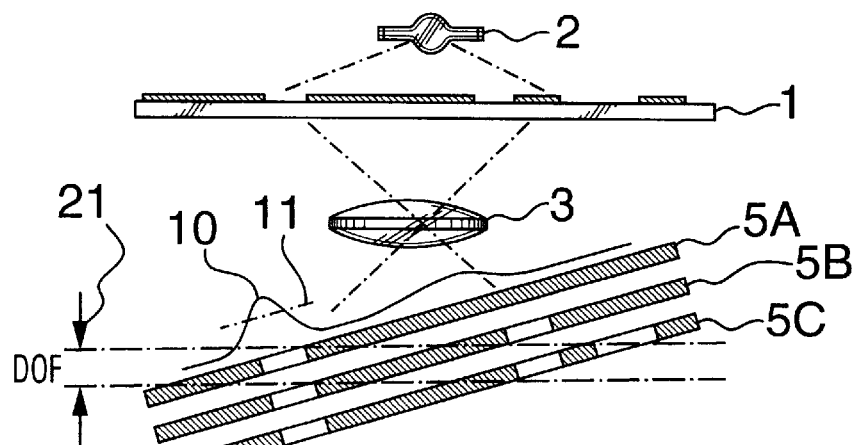
FIG. 10 shows the use of the invention to overcome the shallow depth of focus of an optical system.
Figure 11:
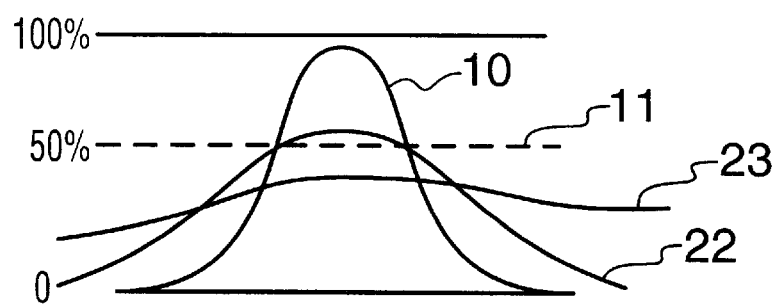
FIG. 11 shows the effect of defocusing in an optical system according to the invention.

Still another example of the invention is used when the image is formed by direct modulation of laser beams. Referring to FIG. 9, tracks A, B, C are recorded on material 5 by relative motion between material 5 and modulated laser spots 15 to 20. By assigning at least two laser spots to each track, such as spots 15 and 16 to track A, 17 and 18 to track B, and 19, 20 to track C no two marks are formed simultaneously adjacent to each other. The diodes in each track are staggered in order to ensure that all effects of recording have dissipated by the time the adjacent mark needs to be recorded. For example, in case of thermal recording, the mark made by diode 17 will have cooled down when it lines up besides diode 15. Spots 15, 17, 19 record only every second mark (i.e. are turned off for the duration of one mark between marks) with the missing marks added by spots 16, 18 and 20. While this arrangement may resemble prior art (such as U.S. Pat. No. 4,743,091) superficially, the crucial difference is using at least two laser spots to record each track, in order to generate the image by imaging overlapping image subsets in register. Still another example of the invention is separating the image subset in the third, or focus dimension. For materials not obeying reciprocity law an out-of-focus image will not register at all. A second image can be recorded on the same area without being affected by the previous out-of-focus image, as long as all imaging effects decayed sufficiently. This is illustrated by FIG. 11, in which graph 10 shows the light distribution of a well focused image, crossing threshold 11 at the correct point for accurate recording of feature size. When imaging systems is slightly defocused the energy under curve 10 will spread into a wider area 22, but it will cross threshold 11 and form approximately the correct feature size. Further defocus will generate a light (or energy) distribution 22, not reaching threshold. In a material not obeying reciprocity law at all (i.e. not subject to linear superposition theory), and in particular if material responds only to peak value of the light energy under curve 23 will dissipate without any permanent effect. For example, if recording material responds to temperature, any heating not reaching the threshold temperature will have not permanent effect as heat will decay and material will return to room temperature. This can be used to overcome focus errors in the imaging system, as shown in FIG. 10. Lens 3 has a depth of focus (DOF) 21. If recording material has parts outside this DOF, only areas within the DOF will be recorded. By positioning recording material at different positions, 5A, 5B and 5C (or keeping material stationary and changing the focus setting of lens 3), a different area will be recorded at each exposure. For example, as recording material is moved from position 5A to 5B to 5C, preferable separating the exposures by pulsing light source 2, different parts fall within the DOF and are imaged. This separation of the image into subset by focus is of great practical importance for optical system with very low values of DOF, such as microlithography machines used to image semiconductors, also know as "Optical Steppers". In this application light source 2 is a pulsed UV source such as an excimer laser and recording material is a thermoresist.

While the above embodiments of the invention uses mainly light, including invisible light, as the energy source, the invention is of a more general nature. For example, it is well known that magnetic recording on "hard" magnetic materials does not follow the law of superposition. A "hard" magnetic material has a square hysteresis loop and small magnetic fields, even for a long duration, cannot change its magnetization. The principle of the invention can be used to increase the pitch of multi-channels magnetic recording heads by recording even and odd channels separately, similar to the layout shown in FIG. 9. It is also not required that the recording be permanent. Recording material 5 can be reversible, such as materials used for erasable optical data storage. Both magneto-optic and phase-change optical data storage material respond to a peak temperature and will benefit from being recorded according to this invention. It should be understood that the invention covers any energy source and any method of separating the image data into subsets of data.

What is claimed is:

1. A method of high resolution recording of an image on a recording material by the imagewise application of energy using a recording material responding only to the instantaneous value of said energy, comprising:

separating said image into a plurality of subsets; and imagewise application of said energy according to said subsets sequentially and in register over the said recording material.

2. A method as claimed in claim 1 wherein all parts of said image in each one of said subset are of the same size and are separated from each other.

3. A method of high resolution recording of an image on a recording material, comprising:

scanning the surface of said material with an array of imagewise modulated energy sources, recording said image in the form of parallel tracks; and having at least two of said energy sources recording each one of said tracks.

4. A method as claimed in claim 3 wherein said energy sources are laser diodes.

5. A method as claimed in claim 3 wherein said energy sources are generated from a laser by using a light valve.

6. A method as in claim 4 wherein said recording material is an optical data storage material.

7. A method as in claim 5 wherein said recording material is an optical data storage material.

8. A method as in claim 3 wherein no two of said energy sources are recording two adjacent areas of said recording material at the same time.

9. A method of high resolution recording of an image on a recording material by the imagewise application of energy comprising:

using a recording material responding only to the instantaneous value of said energy;

recording said image multiple times over the same area of said recording material, each one of said times having said energy come to a focus at a different elevation relative to said recording material.

10. A method of high resolution recording of an image on a recording material comprising:

scanning the surface of said material with an array of imagewise modulated energy sources, recording said image in the form of parallel tracks;

scanning each part of said recording material at least two times, each time having said energy sources come to a focus at a different elevation relative to said recording material.

11. A method for high resolution recording as in any one of the above claims wherein the energy source is a laser.

12. A method for high resolution recording as in any one of claims 1–10 wherein the energy source is a UV laser.

13. A method for high resolution recording as in any one of claims 1–10 wherein the recording material responds to temperature.

14. A method for high resolution recording as in any one of claims 1–10 wherein the recording material is a theimoresist.

15. A method of recording data on a recording material which does not obey the law of linear superposition comprising:

scanning the surface of said recording material with parallel data tracks; and recording said data in a manner preventing the simultaneous recording of adjacent areas of said material.

16. A method as in claim 15 wherein said material is an optical data storage recording material.

17. A method as in claim 15 wherein said material is a magnetic material.

* * * * *